US011579317B2

(12) United States Patent
Menichelli (10) Patent No.: US 11,579,317 B2
(45) Date of Patent: Feb. 14, 2023

(54) HYDROGENATED AMORPHOUS SILICON DETECTOR

(71) Applicant: ISTITUTO NAZIONALE DI FISICA NUCLEARE, Frascati (IT)

(72) Inventor: Mauro Menichelli, Frascati (IT)

(73) Assignee: ISTITUTO NAZIONALE DI FISICA NUCLEARE, Frascati (IT)

(*) Notice: Subject to any disclaimer, the term of this patent is extended or adjusted under 35 U.S.C. 154(b) by 0 days.

(21) Appl. No.: 17/297,441

(22) PCT Filed: Nov. 29, 2019

(86) PCT No.: PCT/IB2019/060336
§ 371 (c)(1),
(2) Date: May 26, 2021

(87) PCT Pub. No.: WO2020/110088
PCT Pub. Date: Jun. 4, 2020

(65) Prior Publication Data
US 2022/0113436 A1    Apr. 14, 2022

(30) Foreign Application Priority Data

Nov. 30, 2018 (IT) .......................... 102018000010735

(51) Int. Cl.
*G01T 1/24* (2006.01)
*H01L 31/0392* (2006.01)

(52) U.S. Cl.
CPC ........ *G01T 1/241* (2013.01); *H01L 31/03921* (2013.01)

(58) Field of Classification Search
CPC .......................... H01L 31/03921; G01T 1/241
See application file for complete search history.

(56) References Cited

U.S. PATENT DOCUMENTS

| 6,943,409 | B1 | 9/2005 | Cheng et al. | |
| 2012/0049242 | A1* | 3/2012 | Atanackovic | H01L 31/068 257/E27.129 |
| 2019/0148534 | A1* | 5/2019 | Zhao | H01L 29/42312 257/29 |

OTHER PUBLICATIONS

Wyrsch et al. Review of amorphous silicon based particle detectors: the quest for single particle detection, Semiconductor Science and Technology vol. 31, No. 10, 103005, 15 pages (Year: 2016).*
Sultan et al. First production of new thin 3D sensors for HL-LHC at FBK, Journal of Instrumentation vol. 12 C01022, 13 pages (Year :2017).*
Rosenfeld et al., "Neutron dosimetry with planar silicon p-i-n diodes" IEEE Transactions on Nuclear Science, vol. 50, No. 6, Dec. 2003 p. 2367-2372.

* cited by examiner

*Primary Examiner* — David P Porta
*Assistant Examiner* — Fani Polyzos Boosalis
(74) *Attorney, Agent, or Firm* — Greer, Burns & Crain, Ltd.; Gregory P. Einhorn (57) ABSTRACT

The invention refers to a detector based on 3D geometry made from a hydrogenated amorphous silicon substrate. This detector finds application in the detection of ionizing radiation.

20 Claims, 4 Drawing Sheets

HYDROGENATED AMORPHOUS SILICON DETECTOR

This application is a national phase application claiming benefit of priority under 35 U.S.C. § 371 to Patent Convention Treaty (PCT) International Application serial number PCT/IB2019/060336, filed Nov. 29, 2019, now pending, which claims the benefit of priority to Italian patent No. 102018000010735 filed on Nov. 30, 2018. The aforementioned applications are expressly incorporated herein by reference in their entirety and for all purposes.

TECHNICAL FIELD OF THE INVENTION

The invention relates to an amorphous silicon detector; more precisely, the invention relates to a detector based on 3D geometry starting from a hydrogenated amorphous silicon substrate.

BACKGROUND

The first study on the hydrogenated amorphous silicon, hereinafter a-Si:H, was reported by Chittik et al. in 1969 J. Electrochem. Soc. 116 77-81 (1969). The material was obtained from growth by plasma vapor deposition (PECVD) of $SiH_4$ (silane). The resulting material had a much lower defect density than the evaporated or sprayed amorphous silicon. Substantial progresses of the a-Si:H technology were made when Spear and Lecomber demonstrated that this material could be doped (both in types n and p) W. Spear and P G Lecomber. Electronic properties of substitutionally doped amorphous Si and Ge Phil. Mag. 33, 935-949 (1976); this has led to the realization of various types of devices such as transistors H C Tuan. Amorphous silicon thin film transistor and its applications to large area electronics Mater. Res. Soc. Proc. 33 247 (1984), solar cells D E Carlson D E and C R Wronski. Amorphous silicon solar cell Appl. Phys. Lett. 28 671-3 (1976) and memories A E Owen et al. Memory switching in amorphous silicon devices J. Non-Cryst. Solids 59-80 1273-80 (1983).

The a-Si:H is a disordered semiconductor; the irregular arrangement of the atoms has the consequence that not all Si—Si bonds can be saturated and this leads to the presence of free bonds (LL). Hydrogen is then introduced into the material for passivating those LLs that act as centers of defects and recombination. The minimum amount of hydrogen needed for passivating most LLs is about 1%.

The hydrogen content in the material has an influence on the bandwidth (by increasing the hydrogen content the band gap widens) and depends on the deposition conditions such as the temperature at which the material is deposited. The typical hydrogen content of the material deposited by PECVD is usually about 10%. The a-Si:H is generally deposited at temperatures of approx. 200° C. from the dissociation of the silane. Hydrogen is generally added to silane and improves the properties of the resulting material. The doping is obtained by adding $PH_3$ to the process gas for a n-type doping or by adding $B_2H_6$ or TMB (Trimethylboron) for a p-type doping.

Due to the relatively large band gap and the disordered nature of the semiconductor which leads to a low mobility of the bearer of charge, a-Si:H is a semi-insulating material with resistivity values higher than 100 $cm^{-1}$. This resistivity can be reduced by more than seven orders of magnitude with p- or n-doping [W. Spear and PG Lecomber. Electronic properties of substitutionally doped amorphous Si and Ge Phil. Mag. 33, 935-949 (1976)].

Particle detectors based on a-Si:H have been built since the mid-1980s [V. Perez-Mendez et al. Detection of charged particles in amorphous silicon layers. Nucl. Instr. Methods Phys. Res. 252 478-82 (1986); V. Perez-Mendez et al. Signal, recombination effects and noise in amorphous silicon detectors Nucl. Instr. Methods Phys. Res. A 260 195-200 (1987)] as pin structure or Schottky diodes; the thickness of these detectors ranged from 1 to 50 µm, however the signal-to-noise ratio was never completely satisfactory (the values of the s/n ratio ranges from 2 to 3) [J. Xi et al. Minimum ionizing particle detection using amorphous silicon diodes Nucl. Instr. Methods Phys. Res. A 301 219-222 (1991); R. Aleksan et al. Observation of single minimum ionizing particles with amorphous silicon diodes. Nucl. Instr. Methods Phys. Res. A 305 512-6 (1991)]. While thick planar detectors are desirable to generate the maximum number of electron-gap pairs (or electron-holes, e-h), the applied electric field generates a too large leakage current; if the electric field is lowered too much the emptying can be incomplete and the collection of charge is only partial. The formation of the signal is given by the drift of the e-h pairs in the intrinsic layer of the diode and therefore depends on the distance traveled. A complete collection is obtained when both the electron and the gap of a generated pair are collected on the diode contacts [B. Equer and A. Karar. 1988 Effect of primary ionization in amorphous silicon detectors Nucl. Instr. Methods Phys. Res. A 271 574-84 (1988)].

Planar a-Si:H detectors have also been used to detect other types of radiation in addition to minimally ionizing particles (MIP), namely: X-rays, neutrons and ions as well as low-energy protons and alpha. As for X-rays, for example, V. Perez-Mendez et al. [The application of thick hydrogenated amorphous silicon layers to charge particle and x-ray detection Mater. Res. Soc. Proc. 149 621-630 (1989)] describe the detection of X-rays of 20 keV by using a planar p-i-n diode. For X-ray energies of 100 keV a detector was developed based on a CsI layer that acts as a scintillator and the resulting light signal is detected by the a-Si:H p-i-n with an efficiency better than 70%. The same article also describes the detection of low-energy protons and alpha particles.

A neutron detection requires a conversion layer. Various types of detectors have been proposed with, for example, a combination of a-Si:H with Gd [A. Mireshghi et al. High efficiency neutron sensitive amorphous silicon pixel detectors. IEEE Trans. Nucl. Sci. 41 915-921 (1994)] or with layers of 10B [F. Foulon et al. Neutron detectors made from chemically vapor deposited semiconductors Mater. Soc. Res. Proc. 487 591 (1998)]. Also a 10B-rich semiconductor could also be directly incorporated in an a-Si:H device. The results of the heavy ion (sulfur) detection test are shown in [C. Bacci et al. Detection of strongly ionizing particles with a hydrogenated amorphous silicon detector Nucl. Instr. Methods Phys. Res. A 306 182-6 (1991)].

The effect of particle radiation and subsequent annealing were studied by Wyrsch et al. in [N. Wyrsch et al. Radiation hardness of amorphous silicon particle sensors. J. Non-Cryst. Solids 352 1797-800 (2006)]; two planar a-Si:H diodes with a thickness of 32.6 and 1.1 microns respectively were irradiated and the results are reported in the article mentioned above.

Figure 1:
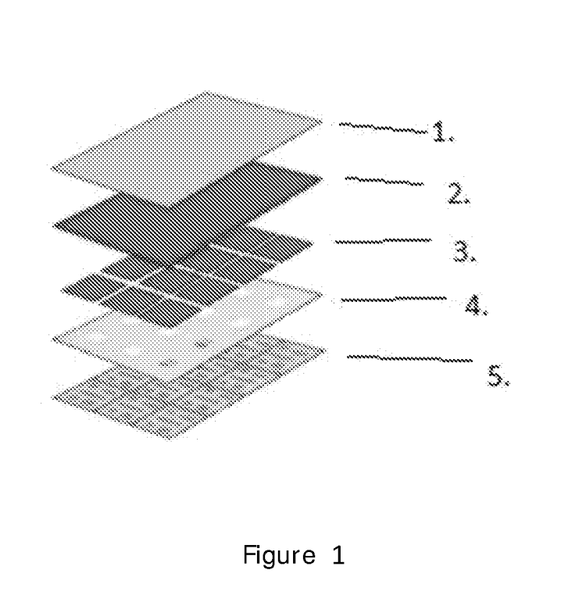
FIG. 1 shows a scheme of a planar detector deposited on the reading circuit belonging to the state of the art; specifically, the polarization electrode 1, the amorphous silicon substrate 2, the collecting electrode 3, the passivation layer 4 and the signal reading circuits 5 are represented from top to bottom.

The best results for the detection of MIP with a-Si:H sensors were obtained with a deposition of a p-i-n diode structure deposited on a reading chip [G. Anelli et al. A new concept of monolithic silicon pixel detectors: hydrogenated amorphous silicon on ASIC. Nuclear Instruments and Methods in Physics Research A 518 (2004) 366-372]. This approach, developed by Siegen University, has been called TFA (Thin Film on ASIC). FIG. 1 shows the layout of the detector.

Despite the advantages mentioned above, the construction of a minimally ionizing good quality radiation detector, in over thirty years of research, has always been difficult: see N. Wyrsch and C. Ballif, Review of amorphous silicon based particle detectors: the quest for single particle detection. Semicond. Sci. Technol. 31 (2016) 103005. The main problem of this detector, built on a planar geometry, is the bad signal/noise ratio determined by the following factors:

1. High emptying voltage. An empirical rule for the emptying voltage on a p-i-n diode (non-irradiated) is $V_d \approx 0.45\, d^2$ (microns), so to empty a 50 micron thick planar detector a polarization voltage of 1100 V is required.
2. Large leakage currents. The currents of these detectors in the emptying mode are of the order of $10^{-1}$-$10^{-6}$ A/cm$^2$.
3. Relatively low efficiency of charge collection. For detectors with a thickness less than 50 microns the collection efficiency is about 50% while the energy required to create an electron-gap pair is similar to that of crystalline silicon (3.4-4.4 eV).

Purpose of the present invention is to overcome the drawbacks of the state of the art.

SUMMARY OF THE INVENTION

Figure 2A:
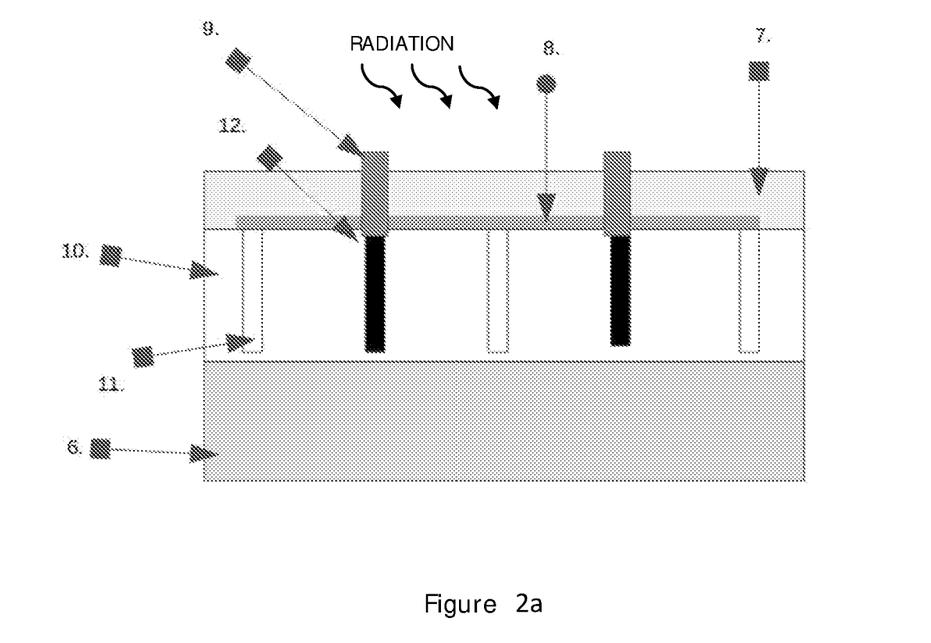
FIGS. 2a and 2b schematically show a vertical section of the detector of the present invention according to two possible configurations; the figures can be well suited from the indicative point of view even if in reality the radiation can come from any direction.
Figure 2B:
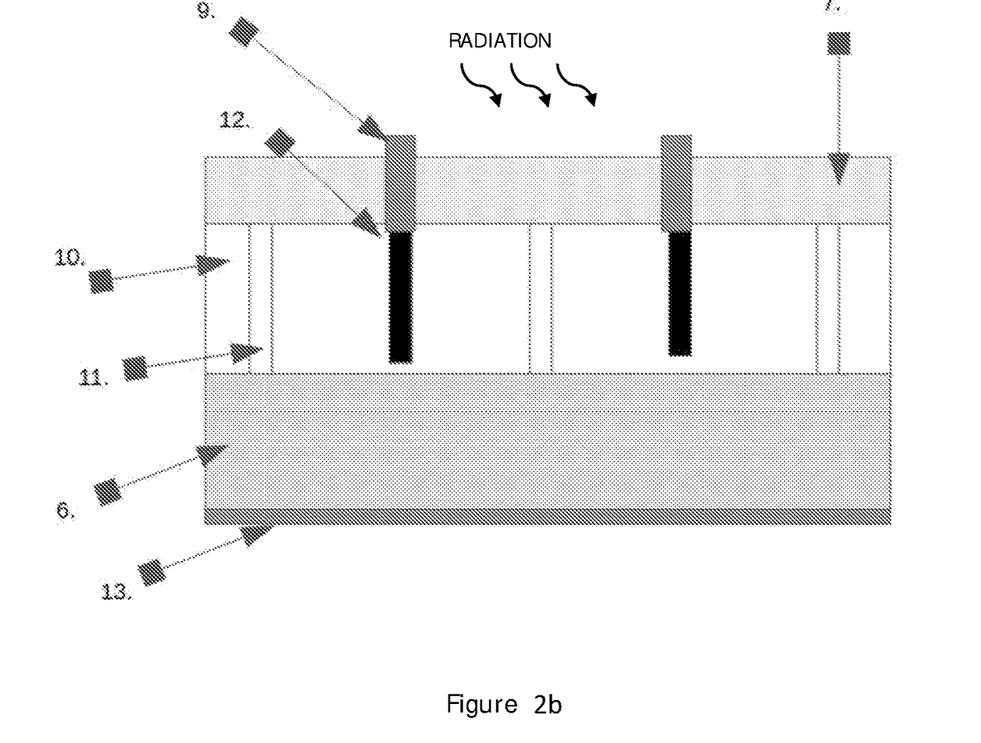

The invention consists in a 3D-geometry radiation detector made from a hydrogenated amorphous silicon substrate which, as made evident by FIGS. 2a and 2b, is formed so as to have two substantially parallel faces, one of which is in contact with a support element in a conductive or semi-conductive p-type doped material and the opposite face of said hydrogenated amorphous silicon substrate is at least partially in contact with a passivation layer. The electrodes placed in said substrate are at least in part columnar electrodes (or fingers). Therefore one of the two faces of the hydrogenated amorphous silicon substrate is always in contact with a support in conductive or semi-conductive p-type doped material.

For the purposes of the present invention, the quality of the detector is determined by the signal/noise ratio. In order to provide a high performance detector it is therefore necessary to increase the signal and/or decrease the noise. Generally, the magnitude of the signal increases as the thickness of the detector and the efficiency of collection of the electric charge signal at the electrodes increase, while the noise is reduced by decreasing the leakage current.

The here described 3D-geometry allows the following:
- by favoring the generation of a charge signal by increasing the thickness of the detector, it is in fact possible to make the substrate grow up to around 100 microns of thickness, without this leading to an increase in noise;
- by increasing the efficiency of charge collection it is possible to have a very low distance between electrodes, approximately equal to 20-30 microns, regardless of the thickness of the detector;
- the generation of noise is reduced by applying an emptying voltage approximately equal to 200 V-400 V and therefore lower compared to the state of the art detectors with equal thickness.

A further advantage of the 3D geometry according to the invention consists in the possibility of obtaining a radial electric field centered on the collection electrodes: the radial structure of the electric field implies that the intensity of the field in the immediate vicinity of the electrodes is maximum and decreases with increasing of the distance from them.

This means that the charge carriers undergo an acceleration in proximity of the electrodes with a positive effect on the speed of collection of the charge with respect to planar detectors.

The invention also consists in the use of said detector in the ionizing radiation detection. This new approach allows to perform detection measures of minimally ionizing radiation with low-cost devices and inherent resistance to damage from radiation.

Further aspects, objects, features and advantages of the detector according to the invention will become evident from the detailed description of the invention which follows and from the drawings which illustrate preferred but not exclusive embodiments, provided purely by way of a non-limiting example.

BRIEF DESCRIPTION OF THE FIGURES

The present invention will be described hereinafter by some preferred embodiments, given by way of non-limiting example, with reference to the attached drawings.

REFERENCE LIST 1. polarization electrode (state of the art)
2. a-Si—H substrate (state of the art)
3. collection electrode (state of the art)
4. passivation (state of the art)
5. signal reading circuits (state of the art)
6. support element in a p-type doped conductive or semi-conductive material
7. passivation layer
8. polarization layer, typically in the form of a grid
9. contact for reading the signal
10. hydrogenated amorphous silicon substrate (a-Si—H)
11. p-type electrode
12. n-type electrode
13. polarization layer, typically in the form of a metal plane

DETAILED DESCRIPTION OF THE INVENTION

The detector of the present invention has a 3D geometry and is made starting from a hydrogenated amorphous silicon substrate.

For a 3D geometry a geometry of the electrodes is meant that uses the entire volume of the detector and the electrodes are therefore not limited to the main surfaces of the same as they penetrate therein in the thickness direction.

For illustrative and non-limiting purposes only, the detector is described below with reference to the attached figures.

It is understood that any modifications may be made to the invention without, however, departing from the purposes of the present invention.

With particular reference to FIGS. 2a and 2b, the ionizing radiation detector according to the invention comprises:
- a support element 6 made of conductive or semi-conductive p-type doped material;
- a hydrogenated amorphous silicon substrate 10 having a first face in contact with said support element 6 and a second face, opposite to the first one, wherein in said substrate 10 the electrodes are obtained which are at least in part columnar electrodes (or fingers); said hydrogenated amorphous silicon substrate 10 is then interposed between the passivation layer 7 and the support element 6 in conductive or semi-conductive p-type doped material, which are never in contact with each other;
- a plurality of p-type electrodes 11 which extend starting from said second face of the substrate 10 in the direction of the thickness of said substrate, able to polarize the detector when powered by a voltage; the p-type electrodes 11 may be shorter (FIG. 2a) or equal (FIG. 2b) than the thickness of the substrate 10 until being in contact with the support 6; the p-type electrodes can either have a columnar (or finger) shape, or in the shape of a trench;
- a plurality of n-type electrodes 12 of a length less than the thickness of the substrate 10, which extend starting from said second face of the substrate 10 in the direction of the thickness of said substrate, suitable for collecting the charge signal generated at the passage of a ionizing radiation in the polarized detector; the n-type electrodes have a columnar (or finger) shape
- a passivation layer 7 placed at least partially in contact with the second face of the substrate 10; said passivation layer 7 is never in contact with the support 6 of p-type doped conductive or semi-conductive material;
- at least one contact for reading the charge signal 9, a signal which is collected by one or more of said n-type electrodes 12.

The detector is further provided with a polarization element which can be realized as a grid electrode 8 positioned on the face of the hydrogenated amorphous silicon substrate 10 which is either in contact with the passivation layer 7 (FIG. 2a), or has the shape of a polarization plane 13 positioned on the lower surface of the support element 6 (FIG. 2b).

For the purposes of the present invention, for a ionizing radiation is meant the radiation that produces an ionization effect in the material that is passed through, including the minimally ionizing radiation also known as ionizing radiation at the minimum or MIP.

The support element 6 is made of a p-type doped conductive or semi-conductive material. The materials suitable for making said support element 6 are selected from metals, for example of the type of: stainless steel, aluminum, chromed brass, PCB (Printed Circuit Board or printed circuits) on which metallic copper is deposited, or semiconductors such as silicon, doped silicon or surface-treated with chromium, molybdenum, aluminum, platinum for the configurations of FIGS. 2a and 2b. It also has the function of supporting the structure of the detector and of allowing its realization starting from the same support 6.

For the purposes of its function, it is not particularly relevant the thickness with which it is made, nevertheless it is preferable that, for greater versatility and ease of use, the support element 6 has a thickness from 10 and 500 micrometers, preferably from 10 to 100 micrometers.

In the device of the invention the passivation layer 7 has the function of preserving and protecting the amorphous silicon layer 6, which is more delicate than the normal silicon. The materials suitable for making the passivation layer 7 can be chosen from the dielectric insulating materials such as silicon oxide, aluminum oxide or Silicon nitride.

The electrodes of the device of the invention can either all be electrodes of the columnar or finger type, or they can have partly the shape of a finger and partly of a trench, but they have never all just the shape of trenches.

The columnar or finger electrodes can be advantageously used for making pixel detectors, where a channel identifies the point of interaction or crossing of the detector. In the case of detectors that employ trench-shaped electrodes, a striped reading is instead formed, which identifies just one single coordinate of the point of interaction of the radiation with the detector, while the pixel identifies two coordinates, therefore the pixel detectors are advantageous as they give a precise location of the interaction point of the radiation on the detector.

In a preferred embodiment of the invention, the p-type electrodes 11, of which further details follow, extend over the whole thickness of the hydrogenated amorphous silicon substrate (a-Si:H) 10 until coming in contact with said support element 6, thus creating a polarization contact. In this situation it is essential that the support element 6 is made either of a conductive material or of a p-type doped semiconductor, preferably made of a p-type doped silicon. In this configuration the support element ensures the polarization of the p-type electrodes. In a preferred embodiment of the invention, use is made of p-type doped supports which are commercially available.

For greater clarity of description, in these circumstances the grid electrode 8, which is instead characteristic of the embodiment shown in FIG. 2a, will not be present. The grid electrode 8 is not necessary in the embodiment of FIG. 2b as the polarization function is already carried out by the polarization plane 13 through the support element 6.

In the embodiment shown in FIG. 2a, instead, the p-type electrodes 11 do not come in contact with the support element 6 and the polarization of these is guaranteed by the presence of the grid electrode 8 placed on the second face of the hydrogenated amorphous silicon substrate 10.

The hydrogenated amorphous silicon substrate 10, also known as a-Si:H, is characterized by a disordered structure and a composition such that the hydrogen stoichiometric percentage varies from 1 to 20% with respect to the silicon component.

The amorphous hydrogenated silicon is produced in its amorphous form, by deposition by the PECVD process (Plasma Enhanced Chemical Vapour Deposition) starting from a mixture of Silane ($SiH_4$) and hydrogen ($H_2$). During the deposition, the hydrogen composition does not faithfully reflect the percentage of the mixture as it also depends on the temperature. The technique, widely described by N. Wyrsch and C. Ballif, Review of amorphous silicon based particle detectors: the quest for single particle detection. Semicond. Sci. Technol. 31 (2016) 103005, is considered known to the person skilled in the art.

Preferably, for the purposes of the present invention, the stoichiometric percentage of hydrogen in the hydrogenated amorphous silicon is comprised between 8 and 15%. Below 1% the passivation could be not optimal as it increases the leak current and reduces the collection efficiency; while above 20% of stoichiometric hydrogen the material tends to assume a polycrystalline form that reduces its resistance to the radiation damage.

The thickness of the substrate 10 is generally comprised between 80 and 130 micrometers. There are currently technological limits for greater thicknesses which in principle would still allow optimum performance.

The extension in the x-y plane of the substrate 10 is not limited and can be scaled in size, being able to vary, by the order of the hundreds of micrometers up to the tens of centimeters, typically of 10-20 centimeters in both dimensions, preferably of 12 cm.

For simplicity of description, as a first face the surface of the substrate 10 is defined which is in contact with the support element 6; as a second face the surface which is opposite to said first face is defined.

A plurality of n-type electrodes 12 and a plurality of p-type electrodes 11 extend within the thickness of the substrate 10 starting from the second face of the substrate. The arrangement of these can follow more or less regular schemes: just for exemplary purposes only FIG. 3a shows the top view of a preferred embodiment in which rows of n-type (light gray) electrodes alternate, in a staggered manner, with rows of p-type (black) electrodes.

Figure 3A:
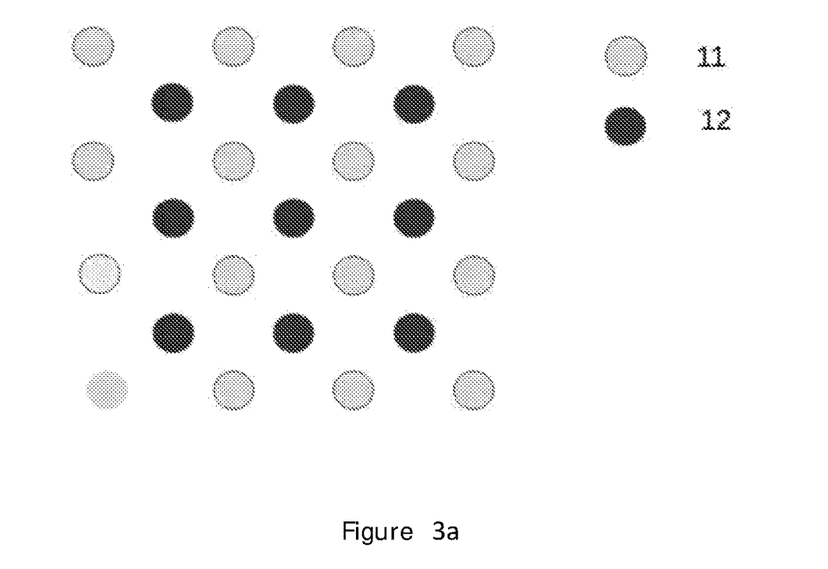
FIGS. 3a-3d represent schematic top views of alternative electrode dispositions (the electrodes are shown in cross-section).
Figure 3B:
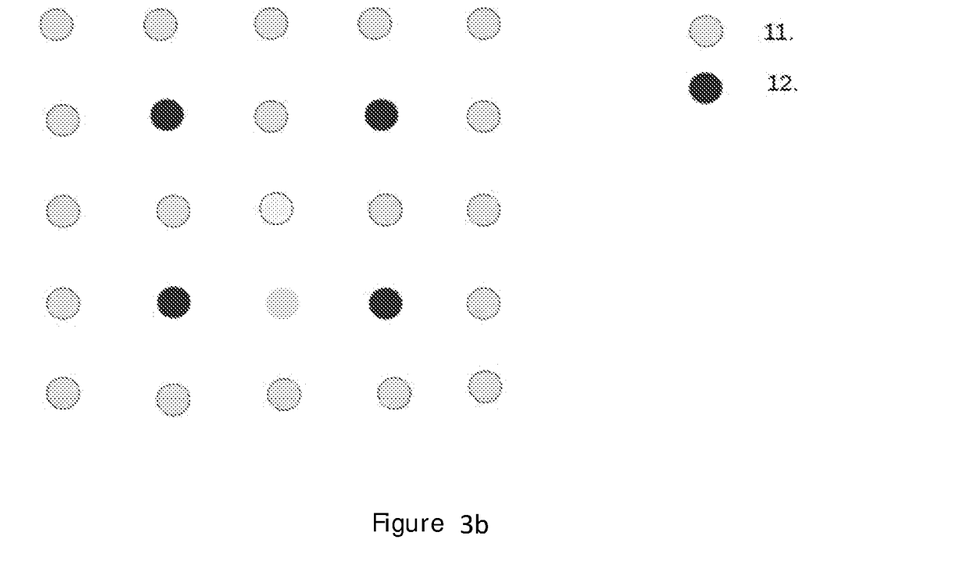
Figure 3C:
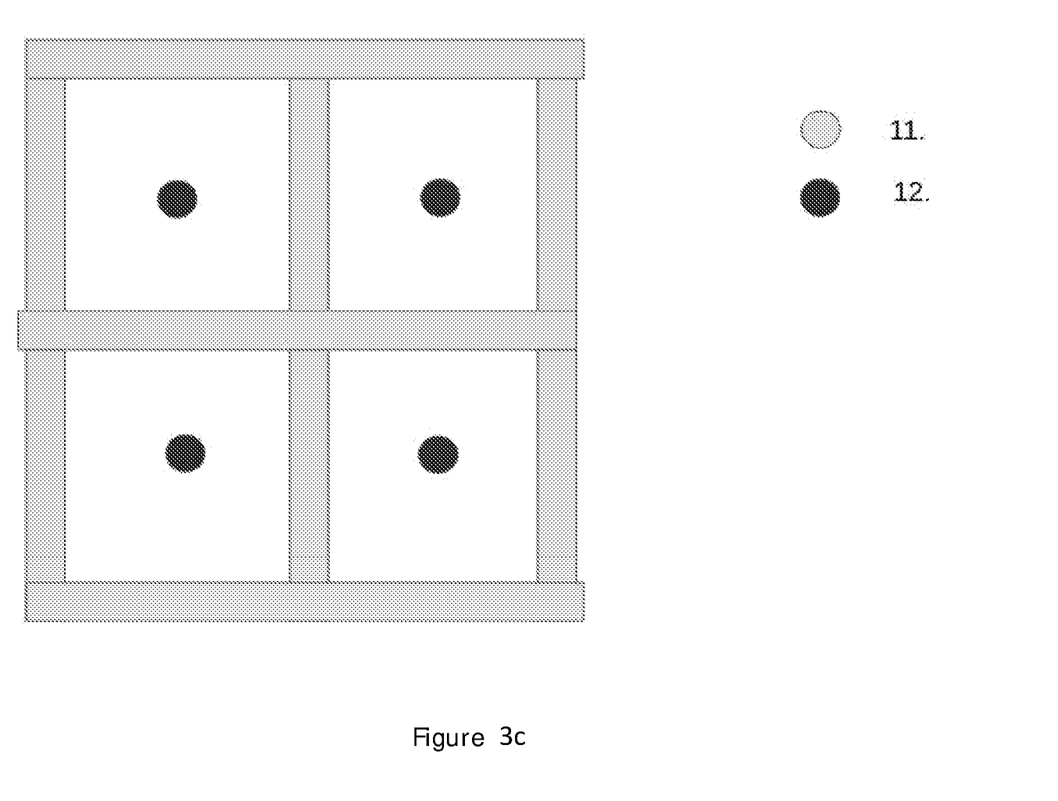
Figure 3D:
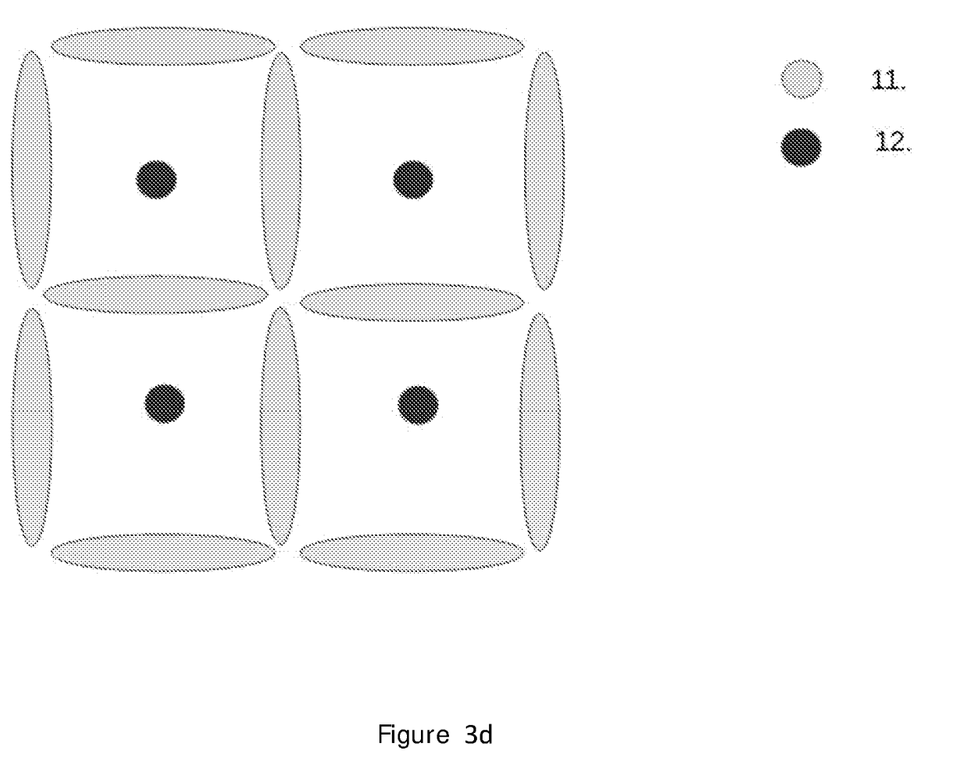

FIG. 3a shows in fact the n-type electrodes 12 and the p-type electrodes 11 arranged alternately along parallel lines drawn on the second face of the substrate. Such disposition is advantageous in terms of ease of construction but can be modified without entailing an extension of the scope of the patent.

The electrodes of the invention, both those of the n-type and those of the p-type have the shape of holes made within the thickness of the a-Si—H 10 substrate and, by way of example and not for limitative purposes, they can be different from each other in section and can have sections of circular, ellipsoidal and trench shape, as shown in FIGS. 3a-3d. It can be deduced that for the purposes of the present invention, with the term "hole" reference will not be made exclusively to circular openings, but rather openings are meant having any of the shapes listed above.

Preferably the mutual distance between n-type electrodes and p-type electrodes is comprised from 10 and 50 micrometers. For reasons of the electric field symmetry it is good that the electrode distribution is regular and has no mis-aligned electrodes.

As is known from the state of the art, for example in J. Millman Microelectronics Ed. Mc Graw Hill ISBN 0-07-066410-2 pp. 12-13, the n-type electrodes can be made by doping with elements chosen from phosphorus (P), arsenic (As) and their compounds and they have the function of collecting the electrons that give rise to the charge signal; the p-type electrodes can instead be made by adding dopings with elements selected from Boron (B), Aluminum (Al), Gallium (Ga) and their compounds and they mainly perform the function of polarizing the volume of the substrate 10.

In the configuration of FIG. 2a, the n-type electrodes are connected either individually or in groups, even up to 40 or more, with an electronic reading channel of the signal, while the p-type electrodes are all connected to the grid electrode and connected to the polarization voltage. In the configuration of FIG. 2b the n-type electrodes are connected either individually or in groups, even up to 40 or more, to an electronic reading channel of the signal, while the p-type electrodes are all connected to the p-doped support through this one, with a common conductor plane connected to the polarization voltage.

In the embodiment shown in FIG. 2a, the n-type electrodes 12 have a maximum depth of 95% in percent with respect to the thickness of the substrate 10, as an electrode which extends even deeper would create too much electric field in the vicinity of the support element 6, which as seen above is p-doped, and the n-doped electrode.

The p-type electrodes 11 may extend for the entire thickness of the substrate 10 (see FIG. 2b) in the absence of a polarization electrode 8, generally in the shape of a grid, on the upper face while, in the presence of the latter one (see FIG. 2a), the upper limit of 95% above applies.

In any case it is advantageous that the electrodes 11, 12 extend as much as possible within the thickness of the substrate 10 to make sure that the applied electric field involves the greatest possible volume of the detector and for collecting the charges on all or almost all the thickness.

Assuming the configuration in FIG. 2a, if the electrodes would penetrate inside the substrate 10 only for 50% of its thickness, the charge generated in the remaining 50% of the thickness would be collected with a lower efficiency than that generated in the part crossed by the electrodes. Furthermore it would also be collected more slowly, thus reducing the collection efficiency and distorting the signal. This explains why it is tried to have the maximum depth of the electrodes, compatibly with what was written previously.

A passivation layer 7 is placed at the second face of the substrate. This layer must leave the contacts with the electrodes and other possible contacts uncovered.

The passivation layer 7, which generally has a thickness between 5 and 50 nm, is preferably made of a material such as silicon nitride or is made of Silicon Nitride.

The function of said layer is to isolate the contacts and protect the active part of the detector from environmental contaminants.

The collection of the signal generated in the detector from the radiation passage is carried out by at least one reading electrode. In a preferred embodiment of the invention, a plurality of reading electrodes are associated each with one of the n-type electrodes 12 present in the substrate.

The n-type electrodes 12 are reading electrodes of the signal that is they perform the function of collecting the charge signal. They can either be read individually or be short-circuited in groups, and read by a reading electronic made for example by a chain formed by a charge integrator followed by a shaper, by an analogic memory, for example of the sample-and-hold type, and by an ADC for the digitization and the subsequent reading through a digital interface connected to a computer. The p-type electrodes 11 can all be grouped together and connected to a polarization voltage provided by a power supply.

Said reading electrodes, or n-type electrodes 12, pass through the passivation layer and are configured so that they can be read with a suitable electronic reading 5 of the conventional type and made, by way of example and not for limitative purposes, by an electronic chain formed by a charge-integration preamplifier, a signal shaper, an analogue memory and an analogic-digital converter. The digitized signal is acquired by a system connected to a computer.

In principle, these signal extraction and processing operations can be performed in real time.

With the device of the invention, pixel detectors capable of reading both the coordinates of the interaction or crossing point of the detector by the radiation, can be realized. The advantage of reading 2 coordinates in a single detector with respect to a "striped" detector that reads only one of them, is especially useful in the detection of X-rays and heavy ions. In fact, while in the detection of charged particles to a minimum ionization (MIP) a reading of two-coordinate can be obtained by putting 2 detectors on the trajectory of the particle and by orienting the strips in an orthogonal way, as, however, the particle to a minimum will cross both of them, in the case of X-rays (or heavy ions) the particles that stop inside a single detector have no way to cross a second detector, and therefore it is not possible to have the complete information on the crossing or interaction point.

The device of the invention is particularly advantageous from the point of view of ease of construction, mainly due to the fact that the layer of hydrogenated amorphous silicon 10 is in direct contact with the conductive support 6. Possible interposed layers, such as for example a passivation layer, would be deleterious in the case of the configuration of FIG. 2b, as they would interrupt the contact between the electrode (the amorphous silicon layer 10) and the support 6 and, in the configurations of FIGS. 2a and 2b, they could anyhow generate problems of "charging" under radiations and a consequent distortion of the electric field in the substrate.

The device of the invention uses hydrogenated amorphous silicon as the detection material, which allows a stable response to be obtained during the irradiation period. The increase in the so-called dark current, that is the current flowing through the detector when it is not crossed by particles, in the case of the hydrogenated amorphous silicon, only worsens by a factor of 2 when it is bombarded by an enormous quantity of $10^{15}$ proton/cm$^2$ type radiations, while in the case of normal silicon it worsens by a factor of 80-100. In the a-Si:H detectors this deterioration can even be canceled if the same detectors are kept 24 hours at the temperature of 100° C. (annealing). After annealing, the detectors start working again at the same dark current that they had before the irradiation. Therefore the detectors built of this material, when exposed to strong doses of radiations, can be used for a longer time without being replaced.

Below a description is made of at least one method for making a detector according to the present invention.

The method for making a detector according to the present invention comprises the following main steps:
  i. provide a support element 6;
  ii. deposit via PECVD a thickness of hydrogenated amorphous silicon forming a substrate 10 such that a first face of the substrate is in contact with the support element 6 and a second face being opposite to the first one;
  iii. produce through DRIE holes which extend starting from the second face of the substrate 10 along the thickness of the substrate itself;
  iv. realize n-type electrodes 12 by means of a deposition through ALD of suitable metal oxides or by doping by ion implantation on at least part of the holes referred to in step iii;
  v. realize p-type electrodes 11 either by means of a deposition through ALD of suitable metal oxides or by doping by ion implantation on the remaining part of the holes referred to in step iii;
  vi. optionally, p-type electrodes 11 can be realized, which are not in contact with the support element 6, and then a grid contact 8 at the second face of the substrate 10 can be provided;
  vii. realize a passivation layer 7 on the second face of the substrate 10 provided with openings located at the n-type electrodes 12;
  viii. optionally, deposition of a metal polarization plane 13 at the support element 6.

The order of the steps of the process described above can be modified on the initiative of the average skilled technician without this leading to an extension of the scope of the present invention. Further process details are given below solely by way of a non-limiting example.

Once having procured the support element 6, the production process of the detector provides a phase of plasma-induced chemical vapor deposition (Plasma-Enhanced Chemical Vapor Deposition or PECVD) of silane and hydrogen at a temperature equal to 200° C. It is possible to use a c-Si support element in the shape of a 6-inch wafer. With this technique, even 100 microns of thickness of a-Si:H can be reached and this can be advantageous in order to reach greater thicknesses, as the thickness is a key factor to increase the signal-to-noise ratio. (Steps i and ii).

Once the a-Si:H substrate has been grown, holes must be made to prepare the production of the electrodes. One technique, known to experts in the field, which can be used for this purpose is the DRIE (Dry Reactive Ion Etching). With the DRIE it is possible to open holes of a few micrometers in diameter with sub-micrometric precision, by maintaining the substrate temperature below 250° C. (Phase iii).

Once the holes have been dug, in order to build the basic structure of the p-i-n electrode of the detector, there is a need to dope the a-Si:H material in the inner surfaces of the holes.

The techniques commonly used for planar structures, such as for example the PECVD deposition of a doped a-Si:H, are not compatible with the 3D geometry of the detector.

A first possibility consists in carrying out a deposition of atomic layers (Atomic Layer Deposition or ALD) of metal oxides: for example, titanium oxide for n-type doping and tungsten oxide or molybdenum oxide for p-type doping. More details on the deposition technique can be found in [SI Park et al. Towards a high efficiency amorphous silicon solar cell using molybdenum oxide as to window layer instead of conventional p-type amorphous silicon carbide] where the same technique has been used for the realization of solar panels. (Steps iv and v, first alternative).

A second alternative is the one represented by the ionic implantation of phosphorus, for a n-type doping, and of boron, for a p-type doping. This implantation step may be followed by a low temperature activation step, for example of 250° C. More details on the ion implantation technique are available in [GN Geaves et al. Environments of ion implanted As and Ga impurities in Hydrogenated amorphous Silicon. Internal note Daresbury laboratory DL/SCI/P754E (1991)]. (Steps iv and v, second alternative).

The detector of the present invention finds application as an ionizing radiation detector.

The use of the detector therefore includes the following main steps:
  have a detector according to the present invention;
  supply the polarization electrode so as to determine a polarization field inside the substrate;
  expose the detector to a flow of ionizing radiation for a period of time;
  measure the signal of the charge collected by the p-type electrodes by means of the reading electrode.

The normal operation of the detector provides that the detector, once polarized by applying a voltage to the electrodes, is exposed to a ionizing radiation such as to generate electron-hole pairs. The charge generated in the amorphous silicon substrate is then collected by the reading electrodes. The signal generated in this way can finally be processed in order to extract information of interest that vary according to the application and the use made of the same.

Regarding the power supply of the detector it is preferable to apply a voltage to the polarization electrodes which depends on the distance between the electrodes 11, 12 and the amount of defects which are not passivated. In the case of detectors with spacing of electrodes of 30 microns tensions are reached that range from −300V up to −1000V in order to determine a polarization field inside the substrate and to empty the substrate from free charges.

The maximum detectable intensity depends on the reading electronics and on the signal collection time; for this application a reading rate of $4 \times 10^6$-particles per second is expected for each reading channel.

In one embodiment, the ionizing radiation consists of X-rays of energy between either 5 and 50 keV or between 5 and 100 keV. This is in fact the case of uses in diagnostic investigations in the field of medicine and materials.

A-Si:H is a material that lends itself to the realization of low-cost and large-area detectors as it uses one of the technologies with which solar panels are built.

Another important aspect that makes this material very interesting is its intrinsic resistance to radiation: the detectors made in a-Si:H can reach exposure levels of $7 \times 10^{15}$ particles/cm$^2$ without suffering significant damage. [M. Despeisse et al. Preliminary radiation tests of 32 μm thick hydrogenated amorphous silicon films. Nuclear Instruments and Methods in Physics Research A 552 (2005) 88-92; N. Wyrsch and C. Ballif, Review of amorphous silicon based particle detectors: the quest for single particle detection. Semicond. Sci. Technol. 31 (2016) 103005] for a planar detector of a-Si:H.

A further interesting feature of a-Si:H is the possibility of deposition, using the PECVD process, on many materials, in particular on the upper part of any type of pixel reading chip, so avoiding bonding techniques in pixel detector applications, which are expensive and problematic (for example: Bump bonding) [G. Anelli et al. A new concept of monolithic silicon pixel detectors: hydrogenated amorphous silicon on ASIC. Nuclear Instruments and Methods in Physics Research A 518 (2004) 366-372].

Examples of devices that can be associated with the detector of the invention are the dosimeters for medical use, in particular in medical diagnostics, and as particle trackers (X-rays and/or charged particles) and X-ray detectors for structural analysis.

Another interesting development of the technology can be its use in sampling calorimetry, by exploiting the low cost of the material: given the overall surface of the detector of a sampling calorimeter, the use of a-Si:H, with respect to an equivalent surface built with c-Si, makes production and/or supply more accessible and economically sustainable.

The invention claimed is:

1. A detector for ionizing radiation comprising:
   a support element (6) made of a material comprising a p-type doped conductive material or a semiconductor material;
   an intrinsic layer comprised of p hydrogenated amorphous silicon substrate (10) of given thickness, provided with two substantially parallel and opposite faces in which a first face is placed in contact with said support element (6) and a second face is opposite to the first one;
   a plurality of p-type electrodes (11) extending from said second face of the hydrogenated amorphous silicon substrate (10) in the direction of the thickness of said intrinsic layer (10), connected to each other by a polarization element (8, 13);
   a plurality of n-type electrodes (12) extending from said second face of the hydrogenated amorphous silicon substrate (10) in the direction of the thickness of said intrinsic layer, suitable for collecting the charge signal generated at the passage of ionizing radiation in the detector;
   a passivation layer (7) placed at least partially in contact with the second face of the intrinsic layer (10) and never being in contact with the support element (6); and
   at least one electrode for reading the charge signal collected by one or more of said n-type electrodes (12) and connected to it by a signal reading contact (9).

2. The detector of claim 1, wherein at least one of the p-type electrodes (11) is in contact with a polarization element (8) placed on the second face of said intrinsic layer (10).

3. The detector of claim 2, wherein the polarization element is shaped like a grid (8).

4. The detector of claim 1, wherein the p-type electrodes (11) extend over the whole thickness of the intrinsic layer (10) until touching the first face of said intrinsic layer (10) thus creating an electrical contact with the polarization element (13) through the support element (6).

5. The detector of claim 1 wherein the support element (6) is made of a material consisting of a semiconductor material.

6. The detector of claim 1, wherein the support element (6) is made of a material comprising: a metal or metallic material; or, a semiconductor material comprising: silicon, or a silicon doped with chromium, molybdenum, aluminum, or platinum or a surface treated with chromium, molybdenum, aluminum, or platinum.

7. The detector of claim 6, wherein the metallic material comprises: stainless steel, aluminum, chromed brass, or a Printed Circuit Board (PCB) on which a metallic copper is deposited.

8. The detector of claim 1, wherein the passivation layer (7) is made of a material comprising: Silicon Oxide, Nitride, or Aluminum Oxide.

9. The detector of claim 1, wherein the stoichiometric percentage of hydrogen in the hydrogenated amorphous silicon is between about 8 and about 15%.

10. The detector of claim 1, wherein the n-type electrodes (12) are all in columnar form and the p-type electrodes (11) are selected from the group consisting of columnar and trench shapes.

11. The detector of claim 1, wherein the n-type electrodes (12) and the p-type electrodes (11) are arranged alternately along the parallel lines drawn on the second face of the intrinsic layer (10).

12. The detector of claim 1, wherein the thickness of the intrinsic layer (10) is greater than about 90 microns.

13. The detector of claim 1, wherein which the n-type electrodes (12) and the p-type electrodes (11) are placed at mutual distances of between about 10 and 50 micrometers.

14. The detector of claim 1, wherein the detector is a pixel detector.

15. A method for using the detector of claim 1, comprising the following steps:
   supplying the polarization electrode (8) so as to determine a polarization field internal to the intrinsic layer (10);
   exposing the detector to a flow of ionizing radiation for a fixed period of time; and
   measuring the charge signal collected by the n-type electrodes (12) using the reading electrode.

16. The method of claim 15, wherein the ionizing radiation comprises X-rays whose energy ranges between about 5 to about 100 keV.

17. An apparatus having contained therein a detector of claim 1.

18. The apparatus of claim 17, wherein the apparatus is selected from the group consisting of: dosimeters for medical use, X-ray detectors for structural analysis and medical diagnostics, particle trackers, and calorimeters.

19. The detector of claim 1, wherein:
the n-type electrodes 12 are made by a method comprising deposition through Atomic Layer Deposition (ALD) of a metal oxide or by doping by ion implantation on at least part of a plurality of hole, wherein the holes extend starting from the second face of the intrinsic layer 10 along the thickness of the intrinsic layer itself; or
the p-type electrodes 11 are made by a method comprising deposition through ALD of a metal oxide.

20. The detector of claim 19, wherein the metal oxide comprises: titanium oxide for n-type doping and tungsten oxide or molybdenum oxide for p-type doping.

\* \* \* \* \*